United States Patent [19]

Benedikt et al.

[11] Patent Number: 5,274,026

[45] Date of Patent: * Dec. 28, 1993

[54] CURABLE POLYCYCLOOLEFIN RESIN SOLUTIONS, THEIR USE IN MAKING PRINTED CIRCUIT BOARDS AND THE BOARDS SO MADE

[75] Inventors: George M. Benedikt, Macedonia; David J. Smith, Sheffield Lake, both of Ohio

[73] Assignee: The B. F. Goodrich Company, Akron, Ohio

[ * ] Notice: The portion of the term of this patent subsequent to Mar. 20, 2007 has been disclaimed.

[21] Appl. No.: 248,371

[22] Filed: Sep. 23, 1988

[51] Int. Cl.$^5$ ............................................. C08L 55/00
[52] U.S. Cl. ................................... 524/553; 525/387; 525/417
[58] Field of Search ................. 524/553; 525/387, 417

[56] References Cited

U.S. PATENT DOCUMENTS

| | | | |
|---|---|---|---|
| 3,318,758 | 5/1967 | Tell | 428/469 |
| 3,508,983 | 4/1970 | Origer et al. | 156/632 |
| 3,558,423 | 1/1971 | Rossetti, Jr. | 428/251 |
| 4,136,247 | 1/1979 | Tenney et al. | 526/283 |
| 4,178,424 | 12/1979 | Tenney et al. | 526/283 |
| 4,241,132 | 12/1980 | Pratt et al. | 428/285 |
| 4,292,106 | 9/1981 | Herschdorfer et al. | 156/243 |
| 4,315,970 | 2/1982 | McGee | 428/412 |
| 4,372,800 | 2/1983 | Oizumi et al. | 156/307.3 |
| 4,451,317 | 5/1984 | Oizumi et al. | 156/307.3 |
| 4,571,279 | 2/1986 | Oizumi et al. | 156/270 |
| 4,639,285 | 1/1987 | Suzuki et al. | 156/272.6 |
| 4,910,077 | 3/1990 | Benedikt | 428/901 |

OTHER PUBLICATIONS

Chemical Abstract No. 72:124634r, "Hybrid Polyimide/Epoxy Glass Multilayer Fabrication".
Chemical Abstract No. 98:162024m, "Metal-Covered Laminates".
Chemical Abstract No. 98:162025n, "Metal-Covered Laminates".
Chemical Abstract No. 98:162026p, "Metal-Covered Laminates".
Chemical Abstract No. 105:135048d, "Multi-Layer Circuit Boards".
Chemical Abstract No. 107:97841p, "Polycyclic Olefin Laminated Boards".
Chemical Abstract No. 107:8574p, "Epoxy Prepregs for Printed-Wiring Boards".
Chemical Abstract No. 107:8575q, "Epoxy Prepregs for Printed-Wiring Boards".
WPI No. 83-00996K/01, "Metal Glass Laminated Plate Manufacture Using Adhesive Comprising Silyl-Modified Organic Polymer".

(List continued on next page.)

Primary Examiner—John C. Bleutge
Assistant Examiner—Mark Sweet
Attorney, Agent, or Firm—Beatrice N. Robbins; Thoburn T. Dunlap

[57] ABSTRACT

Curable polycycloolefin resin solutions having particular utility in the fabrication of printed circuit boards are disclosed. A solvent soluble polymer is typically solution polymerized from norbornene-type monomers in the presence of a metathesis catalyst package. This polymer may then be purified by precipitation and redissolution. A curing agent, such as a high activation temperature peroxide can then be added to the solution and then this curing agent containing solution can be used to impregnate a suitable substrate such as a fiberglass cloth. The impregnated substrate can then be dried, preferably at temperatures above the glass transition temperature of the polycycloolefin but below the activation temperature of the curing agent. Then one or more prepregs can be stacked and laminated to conductive foil at a temperature high enough to activate the curing agent. Printed circuit boards are obtained which have good resistance to organic solvents such as methylene chloride and to molten solder and which also display good electrical properties such as dielectric constant less than about 3.5 at 1 MHz and a dissipation constant less than about 0.005 at 1 MHz.

15 Claims, No Drawings

OTHER PUBLICATIONS

WPI No. 83-759725/37, "Bonding Copper Foil to Backing Material Using Silane Compound as Adhesion Promoter; PCB Print Circuit Board".

WPI No. 74-34559V/19, "Metallised Plastic Substrate, e.g., Electronic Circuit—By Laminating Pretreated Metal Sheet with Plastic Substrate, Removing Metal Layer, and Metallising Exposed Surface".

WPI No. 85-162927/27, "Copper Coated Laminated Plate Production for PCB, Using Unsaturated Resin, e.g., Polyester or Vinyl Ester to Impregnate Base Material".

"Today's Substrates", Murray, *Circuits Manufacturing*, Nov. 1987, p. 25.

"G-10FR Epoxy/Glass Fabric General Purpose Laminate", Norplex, Product Bulletin.

"Adhesion in Mineral-Organic Composites", Norplex, Product Bulletin.

"Adhesion in Mineral-Organic Composites", D. M. Brewis, D. Briggs, John Wiley & Sons, *Industrial Adhesion Problems*, Chapter 6.

*The Kirk-Othmer Encyclopedia of Chemical Technology*, John Wiley & Sons, 1982, vol. 20.

"Some Approaches to Low Dielectric Constant Matrix Resins for Printed Circuit Boards", Butler et al., 15th National SAMPE Technical Conference, 1983.

CURABLE POLYCYCLOOLEFIN RESIN SOLUTIONS, THEIR USE IN MAKING PRINTED CIRCUIT BOARDS AND THE BOARDS SO MADE

BACKGROUND OF THE INVENTION

The electrical and more particularly the electronics industry has been utilizing dielectric substrates for printed circuits for a considerable period. The prime requirement has been to provide a stable non-conductive support for the circuit paths of a conductive material and certain electronic components such as transistors and resistors. Various materials have been used to fabricate these substrates depending on the intended use environment and the electrical and physical properties required to properly function in that environment. These materials have included both thermoplastic and thermosetting polymers which were impregnated into a supporting substrate of paper, fiber glass or synthetic resin fabric.

SUMMARY OF THE INVENTION

The present invention is concerned with the preparation of printed circuit boards by the impregnation of substrates with a solution of a polycycloolefin in an organic solvent followed by the lamination of the impregnated, dried substrate to a conductive foil and the curing of the polycycloolefin to a solvent-insoluble state. The invention is also concerned with compositions suitable for such impregnation which comprise a polycycloolefin which is soluble in appropriate organic solvents, which is capable of undergoing a crosslinking reaction and which is preferably the result of a ring-opening polymerization, a curing agent which will cause further curing of the polycycloolefin to an insoluble state and an organic solvent in which the polycycloolefin is soluble. The polycycloolefin, the curing agent and the solvent are so matched that the solvent can be evaporated at a temperature in excess of the glass transition temperature of the polycycloolefin but below the activation temperature of the curing agent.

The present invention is also concerned with a process for preparing such compositions and utilizing them to prepare printed circuit boards as well as the printed circuit boards are obtained. Preferably the polymerization is conducted in the impregnation solvent, and the final polymer solution is obtained without completely isolating the polymer from this solvent. A curing agent, preferably a thermally activated curing agent, is added to the composition, preferably after the initial polymerization has been completed. The concentration of the polymer solution is adjusted to give a viscosity suitable for impregnation and then an appropriate substrate such as glass fiber cloth is impregnated at a weight ratio of polycycloolefin (solids) to substrate of between 80:20 and 30:70. The solvent is removed by evaporation, preferably at a temperature above the glass transition temperature of the polycycloolefin but below the activation temperature of the curing agent. The impregnated substrate is then laminated to a conductive foil and the curing agent activated to cause the polycycloolefin to crosslink to an insoluble state and to preferably display a glass transition temperature in excess of about 90° C. The circuit board so obtained displays good electrical properties including a dielectric constant of less than about 3.5 at 1 MHz and a dissipation factor of less than about 0.005 at 1 MHz and good physical properties including a low solvent swell, preferably less than about 40% after two minutes in methylene chloride, a low coefficient of linear expansion in the direction normal to the plane of the board, preferably less than 100 ppm/°C., and an adhesion between the conductive foil and the impregnated substrate in excess of about 6 pounds per inch of width.

DETAILED DESCRIPTION OF THE INVENTION

The suitable polycycloolefins are any of those known to the art which can be initially polymerized to a solvent soluble state and which can be subsequently crosslinked to an insoluble state. Among the suitable polymers are those based at least partially upon norbornene or the substituted norbornenes such as 5-methyl-2-norbornene, 5,6-dimethyl-2-norbornene, 5-ethyl-2-norbornene, 5-butyl-2-norbornene, 5-hexyl-2-norbornene, 5-octyl-2-norbornene, 5-dodecyl-2-norbornene, methyltetracyclododecene, cyclopentadiene, tetramers of cyclopentadiene, vinyl norbornene and dicyclopentadiene. Polycycloolefins which are at least partially based on monomers which retain a cyclic structure and have a pendant ethylenically unsaturated bond upon incorporation into the polymer chain are preferred. Especially preferred are polycycloolefins which are at least partially based upon such monomers and which are prepared by ring-opening polymerization, particularly ring-opening polymerization promoted by metathesis catalysts. Most preferred are the polycycloolefins at least partially based upon dicyclopentadiene or vinyl norbornene and prepared by ring-opening polymerization.

The preparation of the polycycloolefins can be in accordance with the techniques known in the art. It is preferred to conduct the polymerization in an organic solvent, particularly one in which the monomers are soluble. The reaction should be conducted in such a way that the polymerization can be terminated before the molecular weight of polycycloolefin becomes too high, such that the viscosity of the polymer solution is too high for the intended end use. The solution viscosity can, of course, be controlled by adjusting the strength of the solution. However, the end use may require both a certain solution strength and a certain viscosity. For instance if impregnation of a glass cloth is to be effected by dipping a solution strength of about 10 weight percent or more is preferred for reasonable polymer uptake levels but a viscosity of about 2000 centistoke or less is also preferred.

One preferred technique is to include a molecular weight regulator such as a non-conjugated acyclic olefin. Included among such suitable acyclic olefins are 1-butene, 3-methyl-1-butene, 2-pentene, 4-methyl-2-pentene and hexene-1. Acyclic olefins with terminal ethylenic unsaturation and non-conjugation are preferred and hexane-1 is especially preferred.

A further preferred technique is to "short-stop" the reaction by the addition of an alcohol. This deactivates the typical metathesis catalysts thus preventing gel formation and facilitates extracting of the heavy metal portion of the catalyst. For instance, if molybdenum pentachloride is used, alcohol short stopping will facilitate its removal from the polymer solution.

The polymerization of particularly reactive monomers can be suitably limited by the neutralization of any acidity present after these monomers have undergone ring-opening polymerization. The ring-opening polymerization product of these monomers such as dicyclopentadiene are believed to be subject to an acid-catalyzed crosslinking reaction which can be inhibited by this neutralization. The acidity may arise from a component of the ring-opening or metathesis catalyst. A number of typical components are classical Lewis acids and others may generate acids in the course of the ring-opening polymerization. Although the neutralization may be accomplished in any appropriate manner such as contact with finely divided solid base of liquid or dissolved base it is preferred to use an aqueous solution of a strong base. It is particularly preferred to use an alkali, alkaline earth or quaternary ammonium (such as tetra alkyl ammonium) base, especially a hydroxide. However, the oxides, carbonates and bicarbonates are also suitable. It is especially preferred to use an aqueous solution of sodium or potassium hydroxide.

The utilization of any amount of base which significantly reduces acidity is to some extent beneficial in reducing undesirable, i.e. premature, crosslinking. However, it is preferred to use sufficient base to ionicly associate with all the chloride ion present. It is particularly preferred to use between about 0.2 and 1.5 parts of base per hundred parts of monomer.

The polymerization is preferably promoted with a metathesis catalyst. Suitable norbornene monomer soluble or monomer insoluble solvent soluble catalysts are well known to the art and include combination of an organo aluminum compound and a tungsten or molybdenum compound. Suitable reaction conditions are taught in U.S. Pat. No. 4,380,617 which also teaches monomer soluble catalysts and which is incorporated herein by reference. Suitable monomer-insoluble but solvent-soluble catalysts are taught in U.S. Pat. No. 4,138,448, incorporated herein by reference. In some cases the catalyst or a portion of its may be insoluble or poorly soluble in the main reaction solvent. In such cases a second solvent may be added to the system to improve the catalyst solubility or the catalyst may be adducted with a solubility enhancing reactant. For instance molybdenum pentachloride may be dissolved in mixture of ethylacetate and toluene while tungsten pentachloride can be adducted with phenol. A particularly preferred catalyst is a combination of ethyl aluminum sesquichloride and molybdenum pentachloride.

The polymerization may be conducted in any organic solvent in which the monomers are soluble. It is preferred to use a solvent in which both the monomers and the forming polycycloolefin is soluble. It is particularly preferred to use a solvent which can be readily rendered a non-solvent for the polycycloolefin while retaining the monomers and low molecular weight oligomers in solution by the addition of an alcohol or an alcohol water mixture. Particularly preferred solvents are cyclohexane and toluene with the latter being the most preferred. Other suitable solvents include aliphatic and cycloaliphatic hydrocarbon solvents containing 4–10 carbon atoms such as pentane, hexane, heptane, octane, cyclooctane and the like; aromatic hydrocarbon solvents containing 6–14 carbon atoms which are liquid or easily liquified such as benzene, xylenes, naphthalene and the like; and substituted hydrocarbons wherein the substituents are inert, such as dichloromethane, chloroform, chlorobenzene, dichloro-benzene and the like.

The concentration of monomers in the solvent may be any value at which appropriate control of the reaction exotherm and east of solution handling and work-up can be maintained. Thus the solution should not be so dilute that the reaction exotherm cannot be handled and large volumes or solvent have to be handled and evaporated. On the other hand the solution should not be so concentrated that the reaction exotherm cannot be handled and the solution viscosity is too high for easy mixing with work-up solvents and short-stop solution.

It is customary to include the acyclic olefin molecular weight modifier as part of the solvent in such calculations. Expressed in accordance with this convention convenient solution concentrations lie between about 10 and 30 weight percent monomers.

The temperature of initial synthesis reaction is not critical. Since the reaction proceeds satisfactorily at ambient temperature (about 20°–25° C.) with a readily accommodated exotherm there is no requirement that particular efforts at thermal control be made.

The appropriate amounts of catalyst components and molecular weight modifiers are interrelated and effected by the reactivity of the monomers used. They should be adjusted in accordance with principles known in the art to obtain molecular weights in the desired range. The tungsten or molybdenum catalyst component is conveniently present at between 0.01 and 50 millimoles, preferably between 0.1 and 10 millimoles, of heavy metal per mole of total monomer. The molar ration between the heavy metal component and the aluminum component based on moles of metal is between 1:200 and 10:1, preferably between 1:10 and 1:1. The molecular weight modifier is typically used in amounts between about 0.01 and 10 moles per mole of monomer charge. With the preferred catalysts and monomers an amount of molecular weight modifier between about 0.5 and 2 moles per mole of monomer is especially preferred.

The polycycloolefin should preferably be polymerized to have a glass transition temperature lower than the highest temperature at which the impregnation solvent will be evaporated. It is particularly preferred that the glass transition temperature be low enough to allow ready evaporation at atmospheric pressure. Although most of the solvent can be conveniently evaporated at temperatures below the polycycloolefin's glass transition temperature, it is usually necessary to exceed this temperature to remove the residual last few percent of solvent.

The maximum temperature used in evaporation should be significantly lower than the activation temperature of the curing agent. This provides a margin of safety in avoiding premature curing or crosslinking during the evaporation of the impregnation solvent. Since the glass transition temperature is lower than this maximum evaporation temperature this also allows for some plastic flow of the polycycloolefin during the lamination operation.

A glass transition temperature below about 130° C. is preferred with a glass transition temperature below about 120° C. being particularly preferred. The only lower limit is that dictated by the need for a high glass transition temperature of the cured laminate. However, the lower the glass transition temperature of the uncured polymer, the higher the loading of curing agent necessary to achieve a particular cured glass transition temperature. With typical loadings of curing agents the glass transition temperature is only increased by between about 10° and 20° C. by curing and it is usually desirable for the cured polycycloolefin to have glass transition temperatures similar to those of the cured epoxy systems used for printed circuit boards, i.e. between about 120° and 130° C. Thus it is preferred to have a glass transition temperature at this intermediate stage of at least about 90° C.

The polycycloolefin having an appropriate glass transition temperature typically has a number average molecular weight between about 15,000 and 100,000 preferably less than about 80,000. It is generally preferable to avoid polymerization to number average molecular weights of about 200,000 or greater.

A preferred procedure which yields preferred intermediate stage polycycloolefins involves polymerization with particular catalyst combinations in an organic solvent at a particular monomer concentration with a particular range of molecular weight regulator. The preferred catalyst combination is an alkyl aluminum halide, especially an alkyl aluminum chloride, and a molybdenum or tungsten halide, especially molybdenum pentachloride, in a molar ratio between about 2:1 and 10:1. It is used at a level between about 0.1 and 5 millimoles of total metal per mole of monomer. The polymerization is conducted at a solution concentration between about 10 and 30 weight percent monomer. The molecular weight control agent is used at between about 0.1 and 3 moles per mole of monomer.

The polycycloolefin is preferably separated from any unpolymerized monomers and low molecular weight oligomers as well as the synthesis catalyst. This can be done by any of the separation techniques known to the art such as distillation or precipitation. However, it is particularly preferred to effect this separation by a coagulation which leaves the intermediate stage polycycloolefin swollen with the reaction solvent. This protects this polymer which still contains fairly reactive ethylenic unsaturation from oxidation. This coagulation can be effected by adding alcohol or an alcohol water mixture to the polycycloolefin solution. Sufficient nonsolvent should be added to form two phases but not so much as to completely precipitate the polycycloolefin. The unreacted monomers as well as any oligomer present will remain in the liquid phase while the polymer will separate as a soft coagulate. In this regard a nonsolvent mixture containing water or another polar solvent is generally preferred because it will extract or dissolve the heavy metal cations which are part of typical metathesis catalysts. An especially preferred coagulant is a mixture of water and an alcohol, especially isopropanol, and an especially preferred mix ratio of alcohol to water is 88 weight percent to 12 weight percent. After the liquid phase is separated by decantation the polymer coagulate is brought back into solution by the addition of clean solvent. This solution may then be washed with water and the solvent separated from the water phase, for instance by decantation, and dried by azeotropic distillation to remove any residual water or alcohol. The removal of residual moisture is of particular interest if a glass based substrate is to be impregnated because it is felt that water may hydrolyze some of the silane groups of the seizing agent normally on the glass to promote its adhesion to polymers. Of course, the washing and decantation may be repeated as necessary to achieve the desired degree of purity. If the polycycloolefin was not synthesized in the solvent which is to be used for impregnating the glass fiber cloth or other substrate material it may be transferred to this solvent during the course of this processing.

The percent of conversion may be conveniently evaluated by isolating an aliquot of this purified intermediate stage polycycloolefin from solution. It can be coagulated with steam or isopropanol and then dried. Alternatively the solvent can simply be evaporated or distilled off. If the solvent is toluene it can be conveniently evaporated by heating the solution in a dish to about 130° C. In any case it is then possible to determine the percent solids of the solution. Thus the weight of obtained polycycloolefin can be compared to the weight of initially charged monomers. Typical conversion values are between about 85 and 95%.

The intermediate stage polycycloolefin solution should be diluted to an appropriate viscosity for impregnation of the supporting substrate. Convenient viscosities are determined by both the nature of the substrate and the nature of the impregnation equipment. In impregnating a typical fiberglass cloth, viscosities between about 100 and 1,000 centistoke at room temperature are preferred. If the impregnation is effected by dipping the substrate in the polycycloolefin solution the more rapidly the substrate is withdrawn the greater is the uptake of solution at a given viscosity. Consequently the greater the withdrawal rate the lower constant polycycloolefin inpregnation level. However, the viscosity should also be kept fairly low to avoid trapping any air bubbles which become entrained in handling of the polymer solution.

The curing agent is preferably added to the polycycloolefin solution either before or after dilution to the desired impregnation viscosity but after the polycycloolefin has been worked-up from its synthesis step.

The curing agent is preferably a substance which promotes crosslinking through the residual ethylenic unsaturation of polycycloolefin once a certain temperature is reached. It is preferably a compound which will generate a free radical upon the application of sufficient heat. It should be selected to have an activation temperature significantly in excess of the maximum temperature used to remove the impregnation solvent from the impregnated substrate. A differential of at least about 20° C. is preferred with a spread of at least about 30° C. being more preferred with a spread of at least about 50° C. being particularly preferred. It should also have an activation temperature significantly in excess of the glass transition temperature of the polycycloolefin so that some plastic flow can occur during the lamination procedure. With convenient impregnation solvents such as toluene an activation temperature in excess of about 160° C., especially in excess of about 180° C. is preferred.

The peroxides are a preferred class of curing agents. The di-tertiary alkyl peroxides are particularly preferred because they are stable at temperatures in excess of 130° C. and have appropriately high activation temperatures. Among the suitable peroxides, are dicumyl peroxide, di-tertiary butyl peroxide, benzoyl peroxide, methyl ethyl ketone peroxide, $\alpha,\alpha'$-bis(t-butyl-peroxy)-diisopropyl benzene and a peroxide of the formula

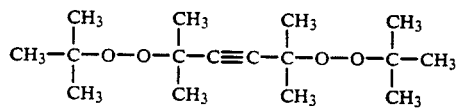

available commercially under the name Lupersol 130 from the Lucidol division of Pennwalt Corporation.

The amount of curing agent utilized depends upon the degree of polymerization of the intermediate stage polycycloolefin, the reactivity of the monomers from which it was formed and the final property requirements of the printed circuit board. Sufficient curing agent should be used to render the final cured impregnated substrate insoluble. It is preferred that the cured substrate not display an excessive degree of solvent swell in common organic solvents and this is conveniently evaluated by the degree of weight gain of a 60 mil thick ½ inch by 1 inch sample upon a two minute, 20° C. exposure to methylene chloride. It is also preferred that the cured polymer have a DSC determined glass transition temperature in excess of 90° C. and that the cured impregnated substrate have a coefficient of linear expansion in the direction normal to the phase of the substrate of less than about 100 ppm per °C. On the other hand, it is preferred that the amount of curing agent not be so great that significant plastic flow in the lamination step is precluded. Suitable amounts for the typical systems lie between about 0.3 and 10 parts or curing agent per 100 parts of polycycloolefin solids, with amounts between about 0.5 and 4.0 being preferred.

The crosslinking and resultant solvent swell resistance of the ultimately cured impregnated substrate may be enhanced by including crosslinking agents in the polycycloolefin solution used to impregnate the substrate. These agents may include any of those generally recognized in the art as promoting the formation of three dimensional networks in addition polymerization. Those compounds carrying two or more non-conjugated ethylenically unsaturated bonds such as 1,3-butylene dimethacrylate, divinyl-benzene or trimethylolpropane triacrylate are particularly preferred. It is preferred to use such agents in an amount between about 1 and 20 parts per hundred parts of polycycloolefin.

Crosslinking agents may advantageously be used to obtain equivalent properties with less curing agent. Some of the curing agents, such as the peroxides, generate undesirable by-products on activation. For instance di-tertiary butyl peroxide decomposes to give tertiary butanol upon activation. The butanol may then boil causing a bubble problem or it may decompose to isobutylene and water, which are both gases at the activation temperature and thus likely to cause bubble problems. Furthermore the increased oxygen content which results from a higher level of peroxide curing agent will increase the dielectric constant and moisture absorption of the cured substrate. Thus it may be advantageous to obtain a given level of solvent swell resistance by a combination of curing agent and crosslinking agent as opposed to be a higher level of curing agent alone.

The addition of a small amount of an antioxidant to the polymer solution is preferred. Any of the art recognized antioxidants is suitable but the hindered phenols such as Ethyl 330 or Irganox 1010 (i.e. tetrakis (methylene-3-(3',5'-di-tert-butyl-4'-hydroxyphenyl) propionate) methane from Ciba Geigy) are preferred. These antioxidants not only improve the shelf life of the polymer solution but also inhibit a premature cure in the lamination step which would otherwise unduly limit the lateral plastic flow. Additions of between about 0.1 and 10, preferably between about 0.5 and 5 parts per hundred parts of polycycloolefin are generally suitable. The antioxidant is preferably added any time after the short stop step but it is particularly preferred at add it before the addition of the curing catalyst.

The substrate to be impregnated may comprise any material which can be readily impregnated and acts as a dielectric under the electric field conditions normally encountered in the printed circuit board environment. It is preferred that the substrate material have a low enough dielectric constant to allow the production of circuit boards having a dielectric constant of less than about 3.5 at 1 Mega Herz. It is also preferred that the material have a fairly low dissipation factor such that boards can be readily produced with a factor less than about 0.005 at 1 Mega Herz. It is further preferred that the substrate have a knitted, woven or other common cloth structure. Fiberglass mats are particularly preferred and woven or knitted fiberglass cloth are especially preferred.

The impregnation rate is appropriately selected to match the end properties desired. The popular fiberglass substrates have dielectric constants higher than the 2.5–2.6 values typical for the polycycloolefin, particularly the polynorbornenes, so that the desire to obtain a low overall dielectric constant will tend to limit the substrate weight content of the final printed circuit board.

On the other hand, the substrate makes a significant contribution to the mechanical properties, especially the coefficient of linear expansion, so it is advantageous not to utilize too low a substrate content. A weight ratio of substrate to polycycloolefin between about 70:30 and 20:80 is preferred with a ratio of between about 60:40 and 40:60 being particularly preferred when the substrate is E glass fiber cloth.

The impregnated substrate should be dried under conditions which avoid the formation of bubbles which either become entrapped in the impregnate matrix or disrupt this resin matrix. It is convenient to dry the substrate in stages by holding it at increasingly higher elevated temperatures for appropriate durations at each temperature to allow for the gradual evolution of the solvent. On illustrative sequence is intervals of about fifteen minutes each in steps of 50° C. It is especially preferred to have a solvent evaporation step at a temperature above the glass transition temperature of the resin matrix. This drying may be effected under reduced pressure but it is convenient to conduct it at atmospheric pressure.

The dried impregnated substrates may then be laminated with a sheet of conductive material to form a circuit board. One or more such substrates may be stacked on top of each other to form a single circuit board. One or both faces of this stack may be laminated to the conductive sheet.

A preferred conductive material is copper sheet. It is particularly preferred to use a copper sheet which has been pretreated to improve its adhesion to the polycycloolefin substrate. An especially preferred copper sheet is an electro deposited sheet with the type of roughened matte face commercially offered for lamination in preparing epoxy based circuit boards. A preferred adhesion promotion treatment involves dipping or spraying this matte surface with a dilute organic solution of an alkoxy-silane, particularly a styryl diamino silane such as 3-(N-styrylmethyl-2-aminoethyl amino)-propyl-trimethoxy-silane hydrochloride, and evaporating off the solvent. It is also feasible to utilize a composite conductive sheet in which one face is copper and the other is an appropriate metal such as tin, silver, solder, gold, aluminum, platinum, titanium, zinc, chrome or an alloy of one or more of these metals with each other or copper.

It is also feasible to cure the polycycloolefin substrate first and then apply the conductive layer to one or both faces of this cured substrate. Appropriate application techniques include vapor deposition, sputtering, ion plating, spraying and layering. However, in general it is preferred to effect the cure of the substrate polycycloolefin and the lamination to the conductive layer or layers in a single step.

The polycycloolefin substrate is cured, and preferably the conductive sheet is laminated to this substrate, by the application of heat and pressure. The pressure is of more significance if lamination of several layers of substrate or lamination of a conductive layer is being effected. The curing temperature is in excess of the activation temperature of the curing agent. It is preferred that the time-temperature profile be such that significant plastic flow can occur. This allows the mating surfaces to accommodate to each other, thus minimizing irregularities and maximizing the degree of thickness uniformity. The precise time temperature profile particularly favored depends upon the activation temperature of the curing agent, the level of curing agent in the polycycloolefin, the glass transition temperature of intermediate stage polycycloolefin, the reactivity of this intermediate stage polycycloolefin and the thermal transfer characteristics of the heating means used. Typically, however, an exposure to between about 180° C. and 220° C. for about ten minutes or more via a heated platen press is adequate.

The lamination is preferably effected at pressures in excess of about 700 psi. It is particularly preferred to use pressures of about 1000 psi, or greater, as long as the pressure is not so excessive as to extrude the polycycloolefin from between the press platens it is suitable, but no particular advantage is foreseen with pressures much in excess of about 100 psi.

The circuit board so obtained has a set of relevant properties generally lying between those of the epoxy based circuit boards and those based upon sintered polytetrafluoroethylene (PTFE). In particular it preferably has a dielectric constant at one Mega Herz (1 HHz) of below about 3.5 more preferably below about 3.1. It preferably displays a dissipation factor at 1 MHz of below about 0.005 more preferably below about 0.003. It preferably has a solvent swell resistance after removal of any laminated conductive foil and when tested at room temperature for two minutes in methylene chloride such that a 60 mil by ½ inch by 1 inch test specimen displays a weight gain of less than about 40%, more preferably less than about 25% and most preferably less than about 15 weight percent. It also preferably has a coefficient of linear expansion in the direction normal to the plane of the board of less than about 100 ppm per °C., more preferably less than about 80 ppm per °C. It further preferably has a polycycloolefin matrix which displays a DSC determined glass transition temperature in excess of about 90° C., more preferably in excess of about 120° C. It additionally should preferably display an adhesion strength between the conductive foil and the impregnated (and now cured) substrate of greater than about 6 pounds per inch of width when strip of foil is pulled at 180° to the original orientation of the strip. Finally it should preferably be able to withstand a 20 second exposure to a 260° C. solder bath without displaying significant blistering or delamination.

A typical circuit board made in accordance with the present invention will display a profile or properties generally in accordance with the values set forth in Table I, which also contains comparative values for epoxy and PTFE boards.

TABLE I

Typical Property Profiles for Polycycloolefin Circuit Board and for Comparative Epoxy and PTFE Circuit Boards

| Type of Board | Epoxy | Poly-Cyclooefin | PTFE |
|---|---|---|---|
| Fiberglass Content (in %) | 50 | 40 | 26 |
| Maximum Operating Temperature (in °C.) | 130 | 140 | 260 |
| Flexural Strength (in psi $10^3$) | | | |
| Length | 88 | 31.2 | 15 |
| Width | 80 | — | 11 |
| Dielectric Constant at 1 MHz | 4.8 | 2.9 | 2.54 |
| Dissipation Factor at 1 MHz | 0.02 | 0.002 | 0.0008 |
| Dielectric Breakdown (in kV) | >55 | >40 | 40 |
| Dielectric Strength (in v/mil) | 1300 | 1600 | 1500 |
| Surface Resistivity (in MΩ) | $5 \times 10^6$ | $2.5 \times 10^7$ | $1 \times 10^5$–$1 \times 10^6$ |
| Volume Resistivity (in MΩ/cm) | $2 \times 10^8$ | $3 \times 10^9$ | $1 \times 10^7$–$1 \times 10^8$ |
| Arc Resistance (in sec) | 100 | 124 | 182 |
| Coefficient of Thermal Expansion Normal to the Plane of the Board (in ppm/°C.) | 55 | 80–90 | 54 |
| Peel Strength of Laminated Copper Foil (in pounds per inch of width) | 11 | 12 | 10 |
| Resistance to 288° C. Solder Bath (20 second exposure) | pass | pass | pass |
| Specific Gravity | 1.84 | 1.3 | 2.2 |

EXAMPLE 1

Step 1

Preparation of a Polycycloolefin Solution of 35 Weight Percent Vinylnorbornene (VNB) and 65 Weight Percent Methyltetracyclododecene (MTD) Copolymer in Toluene 81 g of dry toluene were charged in a 7 oz septum-capped pop bottle containing 30 g of 3 Å molecular sieves followed by 5.73 g VNB, 10.22 g MTD and 4.90 g hexane-1. After 30 minutes the mixture was transferred using nitrogen pressure through a 1 micron filter directly into another 7 oz dry bottle. The solution was slightly pressurized with nitrogen and 0.23 cc of a 25% by weight solution of ethyl-aluminum-sesquichloride (EASC) in dry toluene were introduced into the mixture via a syringe. Subsequently, 1.65 cc of a solution of 2 g of molybdenum pentachloride in 39 g of dry ethyl acetate and 84 g of dry toluene (a 1.6 weight percent solution) were similarly added to the mixture. Within 1 minute a reaction exotherm ensued and the reaction mixture containing about 15 weight percent of polycycloolefin became viscous.

After 15 minutes, 60 cc of a 88/12 (wt/wt) mixture of 2-propanol and water were added to the 7 oz bottle, the mixture shaken and the top layer containing mostly solvents, residual monomers and low molecular weight polymer was discarded. The soft semisolid bottom layer containing the desired copolymer was redissolved in 100 cc toluene, washed with water and the toluene solution dried by azeotropic distillation of part of the solvent.

The polymer was obtained as an up to about a 20 weight percent solution. A small portion of the solution was diluted and mixed with methanol to precipitate the polymer. The precipitated polymer was further isolated by filtration and drying and then heated, cooled and reheated in a Differential Scanning Calorimeter. The glass transition temperature on reheating was determined to be 118° C.

Step 2

Preparation of a Prepreg

The above polymer solution was diluted with toluene to a viscosity of 700 cSt, and filtered through a 3 micron filter to remove insolubles such as the aluminum portion of the metathesis catalyst. 0.6 parts per hundred of resin solids (phr) of Lupersol 130 (a peroxide curing agent whose structure is set forth hereinabove) were added, followed by 1 phr of Irganox 1010 antioxidant (a product of Ciba-Geigy). A glass cloth style 2116 having a finish 642 (from Burlington, Ind.) was impregnated by dipping in the above solution. It was then dried at room temperature until it was tack-free, after which it was dried in a mechanical convection oven for 15 minutes at 50° C., then 15 minutes at 75° C., 20 minutes at 100° C. and finally 10 minutes at 130° C. At this time the prepreg was 16 mils thick, it contained 62% polymer by weight and a total volatiles of less than 2.5%. The polymer coating was still soluble in toluene.

Step 3

Curing and Lamination of the Prepreg

Four plies of above prepregs were laminated between the roughened surfaces of 2 sheets of 35 micron thick 1 oz per ft² electro deposited copper foil with a roughened matte bronze surface marketed by Gould Inc. for use in making epoxy based laminates. The copper foil had been pretreated by dipping for one minute at room temperature in a 0.4 weight percent solution of 3-(N-styrylmethyl-2-aminomethyl-amino)-propyl-trimethoxysilane in methanol. The six layer composite (2 copper foils and 4 prepregs) was subjected to 190° C. and 700 psi between heated press platens for three hours. After this step the copper foil was etched away using commercial etchants and a high degree of crosslinking was evidenced by the lack of tackiness in methylene chloride and by a weight gain of 39.7% by a 60 mil copper foil-devoid board after two minutes in room temperature methylene chloride.

The board exhibited a dielectric constant at 1 MHz of 3.05 and a dissipation factor of 0.003.

EXAMPLE 2

Example 1 was repeated except that 3 phr (based on resin solids) of trimethylolpropane triacrylate were added to the polymer formulation containing 0.6 phr of the Lupersol 130 peroxide. The polymer weight percent after glass cloth impregnation and drying was 62%. After copper foil lamination, curing for 25 minutes from room temperature to 190° c. followed by 2 hours and 35 minutes at 190° C. and subsequent copper etching, the board showed a lack of tackiness in methylene chloride and a weight gain in methylene chloride after two minutes at room temperature of 22.5%. The dielectric constant of the board was 3.1 and the dissipation factor 0.01.

EXAMPLE 3

Example 2 was repeated except that 1.2 phr (based on resin solids) of the Lupersol 130 peroxide were used instead of 0.6 phr. After the copper was removed in the manner disclosed in Example 1, the boards was tack-free in methylene chloride and the weight gain after two minutes at room temperature was 15.3%.

EXAMPLE 4

Example 1 was repeated except that the loading of the Lupersol 130 peroxide was increased from 0.6 to 1.0 phr (based on resin solids). After the copper was removed in the manner disclosed in Example 1, board was tack-free in methylene chloride and the weight gain after 2 minutes at room temperature was 24.8%.

EXAMPLE 5

Example 1 was repeated except that the loading of the Lupersol 130 peroxide was increased from 0.6 to 3.5 phr (based on resin solids) and the hot-press cure cycle included 15 minutes from 180° C. to 220° C. and additional 15 minutes at 220° C. After the copper was removed in the manner as disclosed in claim 1, the board was tack-free in methylene chloride and the weight gain after two minutes at room temperature was 14%.

EXAMPLE 6

Example 1 was repeated except that the loading of the Lupersol 130 peroxide was increased from 0.6 to 1 phr (based on resin solids) and 9 phr (based on resin solids) of divinyl benzene-55 (a divinyl benzene from Dow Chemical) was added. After the copper was removed in the manner disclosed in Example 1, the weight gain after two minutes in methylene chloride at room temperature was 20.4%.

EXAMPLE 7

Step 1

The Preparation of a Polycycloolefin Solution of a 55 Weight Percent Methyltetracyclododecene (MTD), 45 Weight Percent Methylnorbornene (MNB) Copolymer in Toluene The procedure of Example 1 was followed utilizing 48.3 grams of MTD, 40 grams of MNB, 33.6 grams of hexene-1, 305 grams of dry toluene, 4.5 cc of the molybdenum pentachloride solution (a 1.6 weight percent solution in a 68/32 weight mixture of dry toluene and dry ethyl acetate), and 2.56 cc of the 25 weight percent solution of ethyl-aluminum-sesquichloride in dry toluene. The reaction was conducted in a one quart (32 oz) pop bottle.

The polymer solution was worked-up as described in Example 1. The polymer was redissolved in toluene and the toluene solution dried in the manner disclosed in Example 1. A specimen of dry polymer isolated and tested in the manner disclosed in Example 1 displayed a DSC determined glass transition temperature of 114.1° C.

Step 2

Preparation of a Prepreg

The polymer solution was diluted down to a viscosity of 700 centistokes with dry toluene and combined with 0.6 phr (based on resin solids) of the Lupersol 130 peroxide and 1 phr of Irganox 1010 antioxidant. This formulation was impregnated into the same glass cloth as was described in Example 1. The prepreg was then dried in accordance with the time temperature schedule disclosed in Example 1. The dry polymer uptake was found to be 61.2 weight percent.

Step 3

Lamination and Curing of the Prepreg

Four plies of the above prepreg were laminated between the same type of copper foil as used in Example 1 with the roughened face inward by applying 190° C. temperature and a 700 psi pressure with heated press platens for three hours. After the copper was removed in the same manner as in Example 1 the board became tacky in methylene chloride and displayed over a 100% weight gain after 2 minutes at room temperature.

EXAMPLE 8

Example 7 was repeated except that the amount of the Lupersol 130 peroxide was increased from 0.6 to 3.5 phr (based on resin solids). The copper free board did not become tacky in methylene chloride and displayed a weight gain of 34.6% after two minutes at room temperature.

EXAMPLE 9

Step 1

The Preparation of a Polycycloolefin Solution of a 70 Weight Percent Dicyclopentadiene (DCPD), 30 Weight Percent Methylnorbornene (MNB) Copolymer in Toluene The procedure of Example 1 was followed utilizing 73.2 grams of DCPD, 31.2 grams of MNB, 50.2 grams of hexene-1, 525 grams of dry toluene, 6.3 cc of the molybdenum pentachloride solution (a 1.6 weight percent solution in a 68/32 weight mixture of dry toluene and dry ethyl acetate), and 1.8 cc of the 25 weight percent solution of ethyl-aluminum-sesquichloride in dry toluene. The reaction was conducted in a one quart (32 oz) bottle. After the exotherm from the ring-opening polymerization had subsided the catalyst was inactivated or "short-stopped" by the addition of 10 cc of a 10 weight percent sodium hydroxide solution. This inhibited the tendency of the polycycloolefin to crosslink and form insoluble gel particles.

The polymer was isolated from the reaction mixture, redissolved in toluene and the toluene solution dried in the manner disclosed in Example 1.

Step 2

Preparation of a Prepreg

The polymer solution was diluted down to a viscosity of 700 centistokes with dry toluene and combined with 1 phr (based on resin solids) of the Lupersol 130 peroxide and 1 phr of Irganox 1010 antioxidant. This formulation was impregnated into the same glass cloth as was described in Example 1. The prepreg was dried using the time and temperature schedule disclosed in Example 1. The dry polymer uptake was found to be 54.9%.

Step 3

Lamination and Curing of the Prepreg

Four plies of the above prepreg were laminated between the same type of copper foil as used in Example 1 with the roughed side facing inward by applying a temperature of 188° C. and 500 psi pressure with heated press platens for 3 hours. After the copper was removed in the manner disclosed in Example 1 the solvent uptake in methylene chloride was 16.9% after two minutes at room temperature.

EXAMPLE 10

Step 1

Preparation of a Polycycloolefin Solution of an 84 Weight Percent Dicyclopentadiene (DCPD) and 16 Weight Percent Vinylnorbornene (VNB) Copolymer in Toluene The initial polymerization procedure of Example 1 was followed utilizing 527.9 grams of dry toluene, 90.5 grams of DCPD, 17.3 grams of VNB, 47.9 grams of hexene-1, 6.0 cc of the molybdenum pentachloride solution (1.6 weight percent solution in a 68/32 weight mixture of dry toluene and dry ethyl acetate) and 1.7 cc of the 25 weight percent solution of ethyl-aluminum-sesquichloride in dry toluene. The reaction was conducted in a quart (32 oz) bottle.

The reaction was shortstopped with the addition of base. The reaction exotherm from the metathesis catalyzed (ring-opening) polymerization subsided in about ten minutes and then about 10 cc of a 10% by weight sodium hydroxide aqueous solution was added to suppress crosslinking.

The polymer was then isolated from the reaction mixture in a manner similar to that of Example 1. 500 cc of a 88/12 weight mixture of 2-propanol/water were added to the reaction bottle to coagulate the polymer. The upper layer which formed was decanted and the semisolid polymer bottoms were redissolved in toluene and the toluene solution was washed with water. 1 phr of Irganox 1010 antioxidant was added and the solution was dried by azeotropic distillation. The appearance of the solution was slightly opalescent due to the presence of a small amount of microgel. A specimen of polymer isolated and tested in the manner described in Example 1 displayed a DSC determined glass transition temperature of 118° C.

The same polymerization and isolation procedure was repeated with the omission of the addition of caustic solution. The polymer which precipitated upon the addition of the 2-isopropanol/water mixture could not be redissolved in toluene.

Step 2

Preparation of a Prepreg

The polymer solution was diluted down to a viscosity of 700 centistokes with dry toluene and combined with 1 phr (based on resin solids) of the Lupersol 130 peroxide. This formulation was impregnated into the same glass cloth as was described in Example 1. The prepreg was dried using the time and temperature schedule disclosed in Example 1. The dry polymer uptake was found to be 47%.

Step 3

Lamination and Curing of the Prepreg

Four plies of the above prepreg were laminated between the roughened surfaces of 2 sheets of 35 micron thick, 1 oz per ft$^2$ electro deposited copper foil with a roughened matte bronze surface marketed by Gould Inc. for use in making epoxy based circuit boards. The copper foil had been pretreated by dipping for one minute in a 0.4 weight percent solution of 3-(N-styrylmethyl-2-aminomethyl-amino)-propyl-trimethoxy silane hydrochloride in methanol. The six layer composite (2 copper foils and 4 prepregs) was subjected to 188° C. and 500 psi between heated press platens for three hours. After the copper was removed in the manner disclosed in Example 1, the solvent uptake in methylene chloride after two minutes at room temperature was 8.5%.

EXAMPLE 11

Example 10 was repeated with the exceptions that 2.5 phr (based on resin solids) of the Lupersol 130 peroxide was added to the polymer solution used to prepare the prepreg and that the dry resin uptake of the prepreg was 57.5%. After the copper was removed in the manner disclosed in Example 1, the solvent uptake in methylene chloride after two minutes at room temperature was 7.5%.

EXAMPLE 12

A 50 gallon formulation having a viscosity of 200 cSt and containing 15% total solids of the polymer described in Example 1 in dry toluene and also containing 0.6 phr of Lupersol 130 peroxide and 1 phr of Irganox 1010 antioxidant was placed in the holding tank of a commercial continuous treater for the manufacturing of epoxy-glass cloth prepregs. A glass cloth style 1080 having a finish 642 from Burlington Industries was continuously impregnated with the formulation at about 12 ft/min and then subsequently continuously dried in the drying tower of the treater which is operated to have an increasing temperature profile with a maximum temperature of 140° C. and a residence time of 10 minutes. The prepreg showed polymer uptake of 59% and a residual solvent of content 1.5%.

Six layers of the prepreg were laminated as described in Example 1 to adhesion promoted copper foils and cured for 3 hours at 190° C. The board etched free of copper remained non-tacky after 2 minutes of spraying with methylene chloride. The copper peel strength was 8 lbs/inch.

What is claimed is:

1. A liquid composition which is suitable for forming a printed circuit board substrate by impregnating a glass fiber cloth, drying the impregnated glass fiber cloth and laminating a conductive foil to at least one surface of the impregnate comprising:
   (a) a polycycloolefin which is soluble in an organic solvent and is capable of undergoing a crosslinking reaction;
   (b) a curing agent which is activated at a temperature in excess of the glass transition temperature of said polycycloolefin to cause crosslinking of the polycycloolefin; and
   (c) an organic solvent which substantially dissolves the polycycloolefin and which can be evaporated at a temperature below the activation temperature of the curing agent and above the glass transition temperature of the polycycloolefin.

2. The composition of claim 1 which contains between about 0.1 and 10 parts per hundred parts of polycycloolefin of an antioxidant.

3. The composition of claim 2 wherein the antioxidant is a hindered phenol.

4. The composition of claim 1 wherein the polycycloolefin has a glass transition temperature of at least about 90° C.

5. The composition of claim 1 wherein the viscosity is between about 50 and 1,000 centistokes and the solids content is between about 10 and 55 weight percent.

6. The composition of claim 1 wherein the glass transition temperature of the polycycloolefin is below about 130° C.

7. The composition of claim 6 wherein the content of curing agent is sufficient to give the crosslinked polycycloolefin obtained after lamination to the conductive foil a glass transition temperature in excess of about 130° C.

8. The composition of claim 7 wherein the content of the curing agent is sufficient to crosslink the polycycloolefin to the extent that when combined with between about 35 and 80 weight percent of glass fiber cloth the combination displays a coefficient of linear expansion normal to the plane of the board of less than about 100 ppm per °C.

9. The composition of claim 7 wherein the content of curing agent is sufficient to crosslink the polycycloolefin to the extent that a 60 mil specimen displays a solvent swell after a two minute room temperature immersion in methylene chloride of less than about 40 weight percent.

10. The composition of claim 1 wherein the polycycloolefin is a ring-opened substituted polynorbornene.

11. The composition of claim 10 wherein the polynorbornene is a homopolymer or a copolymer of either dicyclopentadiene or methyltetracyclododecene.

12. The composition of claim 11 wherein the polynorbornene is a copolymer of vinyl norbornene or methylnorbornene.

13. The composition of claim 1 wherein the curing agent is a peroxide.

14. The composition of claim 1 which also comprises a crosslinking agent.

15. The composition of claim 14 wherein the crosslinking agent is a compound bearing two or more ethylenically unsaturated bonds of substantially equal reactivity.

* * * * *